United States Patent
Huang et al.

(10) Patent No.: US 6,769,972 B1
(45) Date of Patent: Aug. 3, 2004

(54) CMP POLISHING UNIT WITH GEAR-DRIVEN CONDITIONING DISK DRIVE TRANSMISSION

(75) Inventors: Wen-Jung Huang, Tainan (TW); Tien-Ko Fang, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/461,235

(22) Filed: Jun. 13, 2003

(51) Int. Cl.[7] .................................................. B24B 1/00
(52) U.S. Cl. ........................... 451/287; 451/41; 451/56; 451/60; 451/285; 451/286; 451/288; 451/443; 451/444; 451/446
(58) Field of Search .............................. 451/41, 56, 60, 451/285, 286, 287, 288, 443, 444, 446

(56) References Cited

U.S. PATENT DOCUMENTS

| | | | |
|---|---|---|---|
| 6,126,517 A | * | 10/2000 | Tolles et al. ................... 451/41 |
| 6,293,853 B1 | * | 9/2001 | Perlov et al. .................. 451/56 |
| 6,299,511 B1 | * | 10/2001 | Gurusamy et al. ............ 451/56 |

* cited by examiner

*Primary Examiner*—Joseph J. Hail, III
*Assistant Examiner*—Shantese McDonald
(74) *Attorney, Agent, or Firm*—Tung & Associates

(57) ABSTRACT

A CMP pad conditioning unit having a new and improved drive transmission for transmitting rotation from a drive motor to a conditioning disk on the pad conditioning unit. The drive transmission includes a rotatable transmission shaft that is drivingly engaged by the drive motor and drivingly engages the conditioning disk. In operation, rotation is transmitted from the drive motor to the conditioning disk through the transmission shaft. The drive transmission is characterized by reliability, longevity and enhanced efficiency in the conditioning of substrate polishing pads.

18 Claims, 3 Drawing Sheets

CM P POLISHING UNIT WITH GEAR-DRIVEN CONDITIONING DISK DRIVE TRANSMISSION

FIELD OF THE INVENTION

The present invention relates to disks used in the conditioning of polishing pads on CMP (chemical mechanical polishing) apparatus for semiconductor wafers. More particularly, the present invention relates to a CMP pad conditioning unit having a gear-actuated drive transmission for transmitting rotation from a drive motor to a pad conditioning disk in the pad conditioning unit.

BACKGROUND OF THE INVENTION

Apparatus for polishing thin, flat semiconductor wafers are well-known in the art. Such apparatus normally includes a polishing head which carries a membrane for engaging and forcing a semiconductor wafer against a wetted polishing surface, such as a polishing pad. Either the pad or the polishing head is rotated and oscillates the wafer over the polishing surface. The polishing head is forced downwardly onto the polishing surface by a pressurized air system or similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head, a wafer unload station, or a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in deionized water.

A schematic of a typical CMP apparatus is shown in FIGS. 1A and 1B. The apparatus 20 for chemical mechanical polishing consists of a rotating wafer holder 14 that holds the wafer 10, the appropriate slurry 24, and a polishing pad 12 which is normally mounted to a rotating table 26 by adhesive means. The polishing pad 12 is applied to the wafer surface 22 at a specific pressure. The chemical mechanical polishing method can be used to provide a planar surface on dielectric layers, on deep and shallow trenches that are filled with polysilicon or oxide, and on various metal films.

CMP polishing results from a combination of chemical and mechanical effects. A possible mechanism for the CMP process involves the formation of a chemically altered layer at the surface of the material being polished. The layer is mechanically removed from the underlying bulk material. An altered layer is then regrown on the surface while the process is repeated again. For instance, in metal polishing, a metal oxide may be formed and removed separately.

A polishing pad is typically constructed in two layers overlying a platen with the resilient layer as the outer layer of the pad. The layers are typically made of polyurethane and may include a filler for controlling the dimensional stability of the layers. The polishing pad is usually several times the diameter of a wafer and the wafer is kept off-center on the pad to prevent polishing a non-planar surface onto the wafer. The wafer is also rotated to prevent polishing a taper into the wafer. Although the axis of rotation of the wafer and the axis of rotation of the pad are not collinear, the axes must be parallel.

In a CMP head, large variations in the removal rate, or polishing rate, across the whole wafer area are frequently observed. A thickness variation across the wafer is therefore produced as a major cause for wafer non-uniformity. In the improved CMP head design, even though a pneumatic system for forcing the wafer surface onto a polishing pad is used, the system cannot selectively apply different pressures at different locations on the surface of the wafer. This effect is shown in FIG. 1C, i.e. in a profilometer trace obtained on an 8-inch wafer. The thickness difference between the highest point and the lowest point on the wafer is almost 2,000 angstroms, resulting in a standard deviation of 472 angstroms, or 6.26%. The curve shown in FIG. 1C is plotted with the removal rates in the vertical axis and the distance from the center of the wafer in the horizontal axis. It is seen that the removal rates obtained at the edge portions of the wafer are substantially higher than the removal rates at or near the center of the wafer. The thickness uniformity on the resulting wafer after the CMP process is poor.

The polishing pad 12 is a consumable item used in a semiconductor wafer fabrication process. Under normal wafer fabrication conditions, the polishing pad is replaced after about 12 hours of usage. Polishing pads may be hard, incompressible pads or soft pads. For oxide polishing, hard and stiffer pads are generally used to achieve planarity. Softer pads are generally used in other polishing processes to achieve improved uniformity and smooth surfaces. The hard pads and the soft pads may also be combined in an arrangement of stacked pads for customized applications.

A problem frequently encountered in the use of polishing pads in oxide planarization is the rapid deterioration in oxide polishing rates with successive wafers. The cause for the deterioration is known as "pad glazing", wherein the surface of a polishing pad becomes smooth such that slurry is no longer held in between the fibers of the pad. This physical phenomenon on the pad surface is not caused by any chemical reations between the pad and the slurry.

To remedy the pad glazing effect, numerous techniques of pad conditioning or scrubbing have been proposed to regenerate and restore the pad surface and thereby restore the polishing rates of the pad. The pad conditioning techniques include the use of silicon carbide particles, diamond emery paper, blade or knife for scraping or scoring the polishing pad surface. The goal of the conditioning process is to remove polishing debris from the pad surface and re-open pores in the pad by forming micro-scratches in the surface of the pad for improved pad lifetime. The pad conditioning process can be carried out either during a polishing process, i.e. known as concurrent conditioning, or after a polishing process.

Referring next to FIG. 2A, a conventional CMP apparatus 50 includes a pad conditioning unit 52 having a rotating conditioning disk 66, as well as a polishing pad 56 and a slurry delivery arm 54 positioned over the polishing pad 56. The conditioning head 52 is mounted on a conditioning arm 58 which is extended over the top of the polishing pad 56 for making a sweeping motion across the entire surface of the polishing pad 56 as the conditioning disk 68 is rotated against the polishing pad 56. The slurry delivery arm 54 is equipped with slurry dispensing nozzles 62 which are used for dispensing a slurry solution on the top surface 60 of the polishing pad 56. Surface grooves 64 are further provided in the top surface 60 to facilitate even distribution of the slurry solution and to help entrapping undesirable particles that are generated by coagulated slurry solution or any other foreign particles which have fallen on top of the polishing pad 56 during a polishing process. The surface grooves 64, while serving an important function of distributing the slurry, also presents a processing problem when the pad surface 60 gradually wears out after prolonged use.

Referring next to FIG. 3A, one type of CMP apparatus which is currently in widespread usage is the MIRRA (TM) CMP apparatus, available from Applied Materials, Inc., of Santa Clara, Calif. The pad conditioning unit 68 of the MIRRA (TM) CMP apparatus includes a motor housing 69 which houses a motor 70. A drive pulley 72 is mounted on a drive shaft 71 which is engaged by the motor 70. The motor housing 69 is mounted on one end of an elongated conditioning arm 73. A conditioning head 76 is provided on the opposite end of the conditioning arm 73. An idle pulley 78 engages a conditioning disk 77 that is rotatably mounted on the bottom surface of the conditioning head 76. A continuous drive belt 74 engages the drive pulley 72 and the idle pulley 78. Accordingly, rotation of the drive pulley 72 is transmitted to the idle pulley 78 via the drive belt 74, thereby rotating the conditioning disk 77 against a polishing pad 80 as the conditioning disk 77 is used to condition the polishing pad 80.

The conventional pad conditioning unit 68 of the MIRRA (TM) CMP apparatus is associated with at least two drawbacks. First, during the CMP operation, the counterbalance of the down force applied by the conditioning disk 77 against the polishing pad 80 causes the conditioning arm 73 to bend upwardly between the motor housing 69 and the conditioning head 76. Consequently, the idle pulley 78 is disposed at a higher level than the drive pulley 72, and this distorts the drive belt 74. Second, because the tension of the drive belt 74 on the pulleys 72, 78 is not adjustable, the drive belt 74 has a tendency to wobble during operation. Both of these factors tend to cause premature wearing and breakage of the drive belt 74, as well as non-uniformity in the magnitude of pressure applied to the polishing pad 80 among all regions of the conditioning disk 77. Accordingly, a new and improved conditioning disk drive transmission is needed which is particularly adapted for the pad conditioning unit of a Mirra CMP apparatus.

An object of the present invention is to provide a new and improved conditioning disk drive transmission for a pad conditioning unit on a CMP apparatus.

Another object of the present invention is to provide a new and improved conditioning disk drive transmission which enhances operational reliability of a pad conditioning unit on a CMP apparatus.

Yet another object of the present invention is to provide a new and improved conditioning disk drive transmission which is particularly well-suited to a pad conditioning unit on a MIRRA (TM) CMP apparatus.

Still another object of the present invention is to provide a new and improved conditioning disk drive transmission which includes a gear system for transmitting rotation from a drive motor to a conditioning disk on a pad conditioning unit in a CMP apparatus.

Yet another object of the present invention is to provide a CMP apparatus pad conditioning unit which includes a new and improved conditioning disk drive transmission.

A still further object of the present invention is to provide a new and improved CMP pad conditioning unit having a conditioning arm, a transmission shaft rotatably carried by the conditioning arm, a drive motor drivingly engaging the transmission shaft for rotating the transmission shaft and a conditioning disk drivingly engaged by the transmission shaft for rotation by the transmission shaft.

SUMMARY OF THE INVENTION

In accordance with these and other objects and advantages, the present invention is generally directed to a CMP pad conditioning unit having a new and improved drive transmission for transmitting rotation from a drive motor to a conditioning disk on the pad conditioning unit. The drive transmission includes a rotatable transmission shaft that is drivingly engaged by the drive motor and drivingly engages the conditioning disk. In operation, rotation is transmitted from the drive motor to the conditioning disk through the transmission shaft. The drive transmission is characterized by reliability, longevity and enhanced efficiency in the conditioning of substrate polishing pads.

In a preferred embodiment, meshing drive gears are engaged by the drive motor and the transmission shaft, respectively, for transmitting rotation from the drive motor to the transmission shaft. Meshing idle gears are engaged by the transmission shaft and the conditioning disk, respectively, for transmitting rotation from the transmission shaft to the conditioning disk.

In a most preferred embodiment, a drive pinion gear is drivingly engaged by the drive motor and meshes with a drive worm gear provided on the transmission shaft to transmit rotation from the drive motor to the transmission shaft. An idle pinion gear drivingly engages the conditioning disk and meshes with an idle worm gear provided on the transmission shaft to transmit rotation from the transmission shaft to the conditioning disk.

BRIEF DESCRIPTION OF THE DRAWINGS

The invention will now be described, by way of example, with reference to the accompanying drawings, in which:

FIG. 1B is an enlarged, cross-sectional view of a section of a wafer and the polishing pad of a conventional CMP apparatus, with a slurry solution there between;

DESCRIPTION OF THE PREFERRED EMBODIMENTS

The present invention is generally directed to a new and improved drive transmission for a conditioning disk on a conditioning unit of a chemical mechanical polisher. The drive transmission typically utilizes a dual pinion gear/worm gear arrangement to transmit drive rotation from a drive motor to a polishing pad conditioning disk on a pad conditioning unit of a CMP (chemical mechanical polishing) apparatus. However, other types of gear arrangements, including bevel gears, in non-exclusive particular, may be used to transmit the rotation from the drive motor to the conditioning disk. The conditioning disk drive transmission of the present invention is characterized by enhanced reliability, longevity and efficiency in the conditioning of polishing pads used in the polishing of semiconductor wafer substrates. While the conditioning disk drive transmission of the present invention is particularly adapted for pad conditioning units on a MIRRA (TM) CMP apparatus available from Applied Materials, Inc., it will be understood by those skilled in the art that the present invention may be equally applicable to pad conditioning units on other types of CMP apparatus.

Figure 1A:
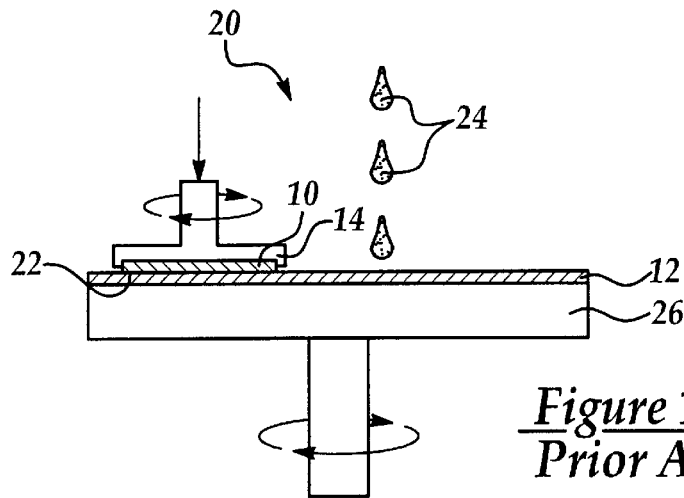
FIG. 1A is a cross-sectional view of a typical conventional chemical mechanical polishing (CMP) apparatus.
Figure 1B:
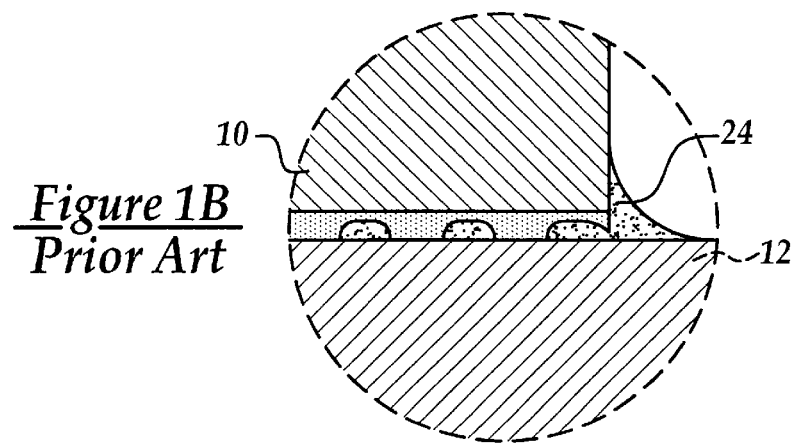
Figure 1C:
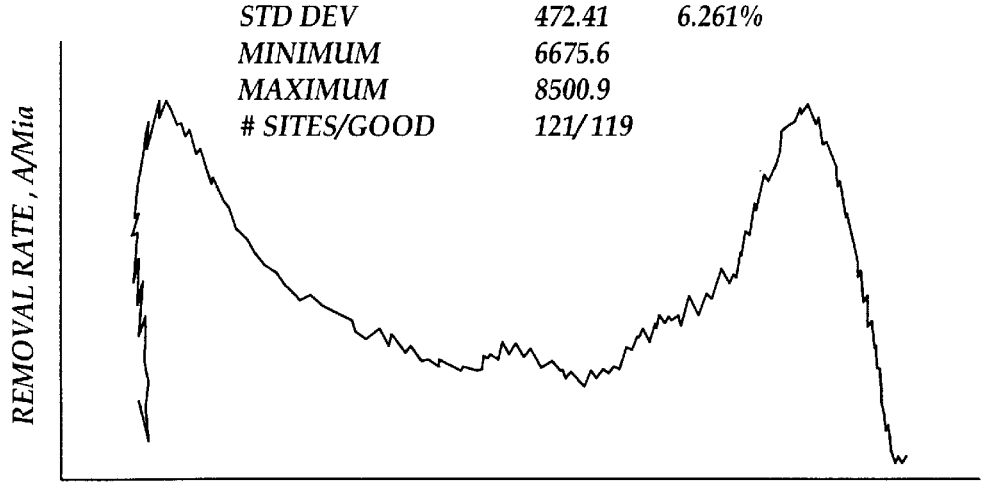
FIG. 1C is a graph illustrating the changes in removal rates as a function of distance on a wafer after a polishing pad is repeatedly used.
Figure 2A:
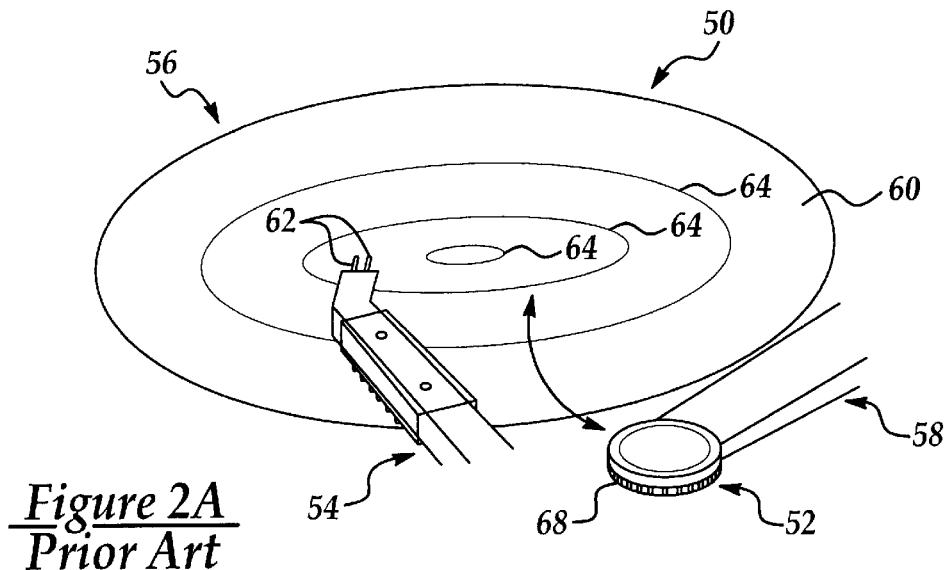
FIG. 2A is a perspective view of a conventional CMP polishing pad with a slurry dispensing arm and a pad conditioning unit positioned on top.
Figure 3A:
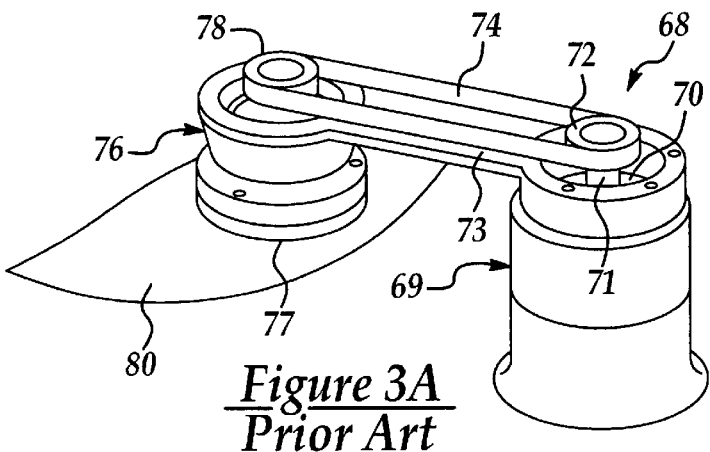
FIG. 3A is a perspective view of a conventional, belt-driven pad conditioning unit on a MIRRA (TM)-type CMP apparatus.
Figure 4:
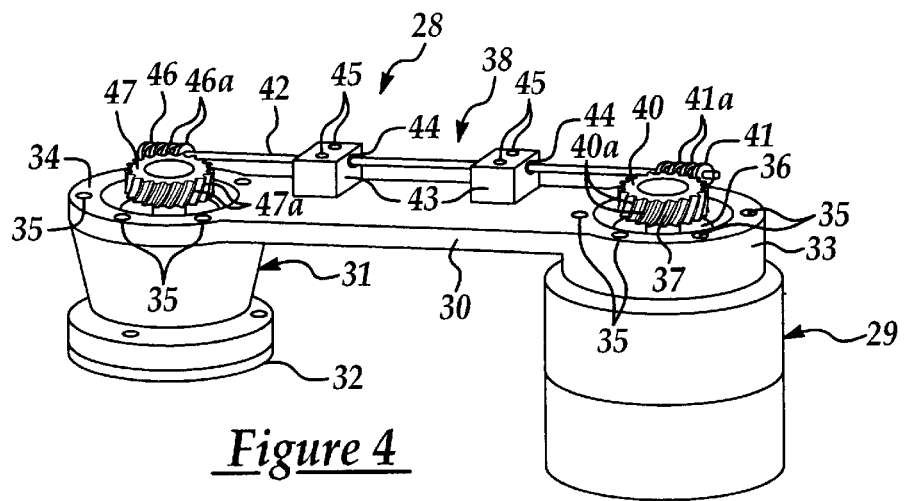
FIG. 4 is a perspective view of an illustrative embodiment of a pad conditioning unit including the conditioning disk drive transmission of the present invention.
Figure 5:
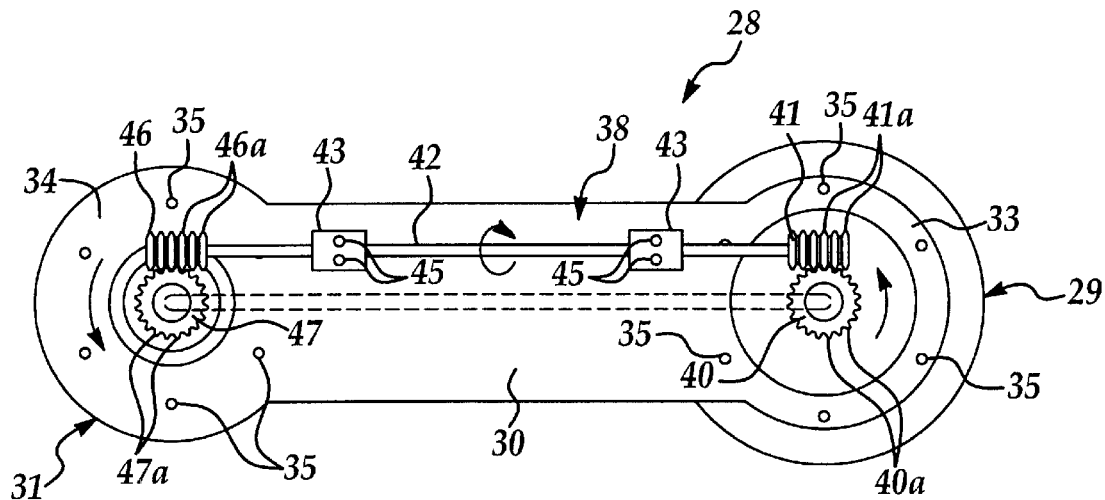
FIG. 5 is a top view of the pad conditioning unit of the present invention.
Figure 6:
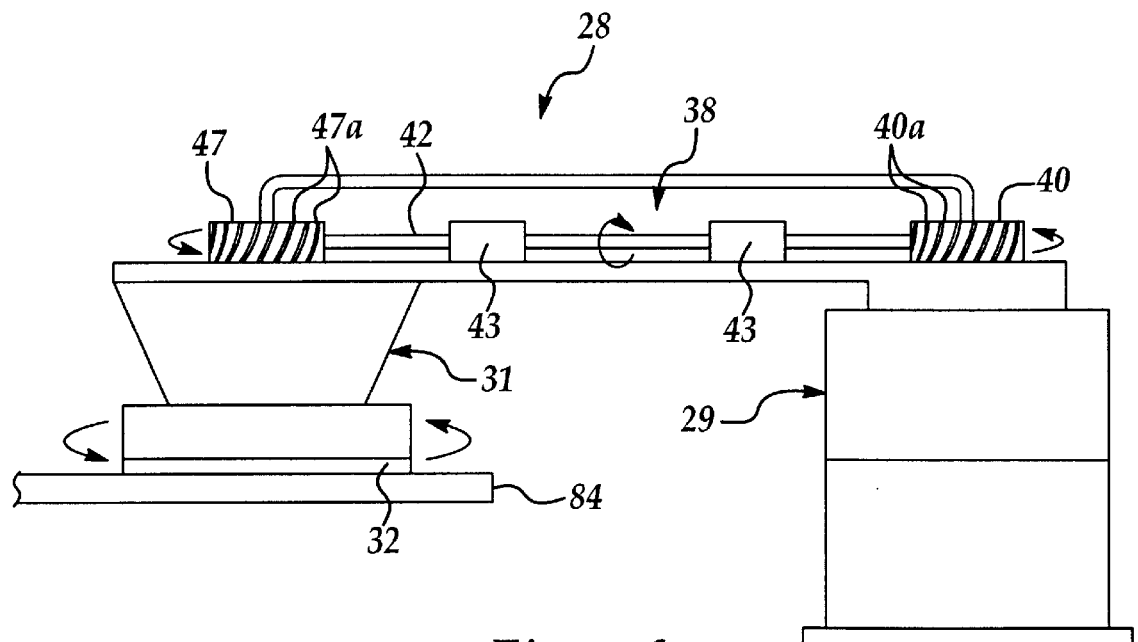
FIG. 6 is a side view of the pad conditioning unit of the present invention, in operation of the apparatus.

Referring to FIGS. 4–6, an illustrative embodiment of a pad conditioning unit 28 in accordance with the present invention includes a motor housing 29 that is mounted typically using screws 35 on the bottom surface of a motor housing collar 33, provided on one end of an elongated, horizontal conditioning arm 30. The motor housing 29 contains a drive motor 36 that engages a drive shaft 37. A conditioning head 31 is mounted, typically using screws 35, on the bottom surface of a conditioning head collar 34 that is provided on the end of the conditioning arm 30 opposite the motor housing 29. A conditioning disk 32 is rotatably mounted on the bottom surface of the conditioning head 31 for rotation against a polishing pad 84, as shown in FIG. 6 and hereinafter further described.

The pad conditioning unit 28 includes a conditioning disk drive transmission 38, which includes a drive pinion gear 40 that has multiple gear teeth 40a and is mounted on the drive shaft 37. An idle pinion gear 47, having multiple gear teeth 47a, is mounted on an idle shaft (not shown) which engages the conditioning disk 32. At least one, and typically, a pair of spaced-apart shaft bearing blocks 43 is mounted on the upper surface of the conditioning arm 30, typically using screws 45. An elongated transmission shaft 42 extends through aligned bearing openings 44 in the shaft bearing blocks 43 and is rotatably mounted in the bearing openings 44. A drive worm gear 41, having gear teeth 41a which mesh with the gear teeth 40a of the drive pinion gear 40, is mounted on one end of the transmission shaft 42. An idle worm gear 46, having gear teeth 46a which mesh with the gear teeth 47a of the idle pinion gear 47, is mounted on the opposite end of the transmission shaft 42. Accordingly, as shown in FIG. 5, by operation of the drive motor 36, rotation is transmitted from the drive shaft 37 to the conditioning disk 32 through the drive pinion gear 40, the drive worm gear 41, the transmission shaft 42 (which rotates in the respective shaft bearing blocks 43), the idle worm gear 46 and the idle pinion gear 47, respectively.

In application, the pad conditioning unit 28 is used to condition a polishing pad 84 for subsequent chemical mechanical polishing of semiconductor wafer substrates (not shown) in the fabrication of integrated circuits on the substrates. The pad conditioning unit 28 is typically used as a component part of a MIRRA (TM) or similar type of CMP apparatus (not shown). Accordingly, the conditioning disk 32 is initially rotatably mounted on a disk support (not shown) provided in the conditioning head 31, typically using a threaded fastener (not shown) or according to other techniques known by those skilled in the art. As it is rotated on the conditioning head 31 by operation of the drive motor 36, via the drive shaft 37, the drive pinion gear 40, the drive worm gear 41, the transmission shaft 42, the idle worm gear 46 and the idle pinion gear 47, respectively, the conditioning disk 32 is pressed downwardly against the upper surface of the polishing pad 84 as the conditioning arm 30 is typically swept in a back-and-forth motion across the surface of the polishing pad 84. This combined rotating and sweeping action of the conditioning disk 32 against the polishing pad 84 scores and conditions the polishing pad 84 for subsequent CMP operations. It will be appreciated by those skilled in the art that the down-force exerted by the conditioning head 31 against the polishing pad 84 does not distort or otherwise compromise the functional integrity of the conditioning disk drive transmission 38. Consequently, the conditioning disk drive transmission 38 is capable of prolonged, repeated and reliable use and is resistant to operational vibration while enabling a substantially uniform down-pressure among all regions of the conditioning disk 32 against the polishing pad 84. This characteristic results in uniform conditioning of the polishing pad 84 for the subsequent optimum and efficient polishing of semiconductor wafer substrates using the polishing pad 84.

While the preferred embodiments of the invention have been described above, it will be recognized and understood that various modifications can be made in the invention and the appended claims are intended to cover all such modifications which may fall within the spirit and scope of the invention.

What is claimed is:

1. A pad conditioning unit for a CMP apparatus, comprising:
   a conditioning arm;
   a transmission shaft rotatably carried by said conditioning arm;
   a drive motor drivingly engaging said transmission shaft for rotating said transmission shaft;
   a first drive gear drivingly engaged by said drive motor and a second drive gear carried by said transmission shaft in meshing relationship to said first drive gear; and
   a conditioning disk drivingly engaged by said transmission shaft for rotation by said transmission shaft.

2. The pad conditioning unit of claim 1 further comprising a first idle gear drivingly engaging said conditioning disk and a second idle gear carried by said transmission shaft in meshing relationship to said first idle gear.

3. The pad conditioning unit of claim 2 further comprising a first drive gear drivingly engaged by said drive motor and a second drive gear carried by said transmission shaft in meshing relationship to said first drive gear.

4. The pad conditioning unit of claim 3 wherein said first drive gear comprises a drive pinion gear and said second drive gear comprises a drive worm gear.

5. The pad conditioning unit of claim 4 wherein said first idle gear comprises an idle pinion gear and said second idle gear comprises an idle worm gear.

6. The pad conditioning unit of claim 5 further comprising at least one shaft bearing block carried by said conditioning arm and wherein said transmission shaft is rotatably carried by said at least one shaft bearing block.

7. The pad conditioning unit of claim 2 wherein said first idle gear comprises an idle pinion gear and said second idle gear comprises an idle worm gear.

8. The pad conditioning unit of claim 1 further comprising at least one shaft bearing block carried by said conditioning arm and wherein said transmission shaft is rotatably carried by said at least one shaft bearing block.

9. The pad conditioning unit of claim 8 further comprising a first drive gear drivingly engaged by said drive motor and a second drive gear carried by said transmission shaft in meshing relationship to said first drive gear.

10. The pad conditioning unit of claim 8 further comprising a first idle gear drivingly engaging said conditioning disk and a second idle gear carried by said transmission shaft in meshing relationship to said first idle gear.

11. The pad conditioning unit of claim 10 further comprising a first drive gear drivingly engaged by said drive motor and a second drive gear carried by said transmission shaft in meshing relationship to said first drive gear.

12. A pad conditioning unit for a CMP apparatus, comprising:
a conditioning arm having a conditioning head and a motor housing spaced from said conditioning head;
a transmission shaft rotatably carried by said conditioning arm;
a drive motor provided in said motor housing and drivingly engaging said transmission shaft for rotating said transmission shaft;
a first drive gear drivingly engaged by said drive motor and a second drive gear carried by said transmission shaft in meshing relationship to said first drive gear; and
a conditioning disk rotatably carried by said conditioning head and drivingly engaged by said transmission shaft for rotation by said transmission shaft.

13. The pad conditioning unit of claim 12 further comprising a first idle gear drivingly engaging said polishing disk and a second idle gear carried by said transmission shaft in meshing relationship to said first idle gear.

14. The pad conditioning unit of claim 12 further comprising at least one shaft bearing block carried by said conditioning arm and wherein said transmission shaft is rotatably carried by said at least one shaft bearing block.

15. A pad conditioning unit for a CMP apparatus, comprising:
a conditioning arm having a conditioning head and a motor housing spaced from said conditioning head;
a pair of spaced-apart shaft bearing blocks carried by said conditioning arm;
a transmission shaft rotatably carried by said pair of spaced-apart shaft bearing blocks;
a drive motor provided in said motor housing and drivingly engaging said transmission shaft for rotating said transmission shaft; and
a conditioning disk rotatably carried by said conditioning head and drivingly engaged by said transmission shaft for rotation by said transmission shaft.

16. The pad conditioning unit of claim 15 further comprising a first drive gear drivingly engaged by said drive motor and a second drive gear carried by said transmission shaft in meshing relationship to said first drive gear.

17. The pad conditioning unit of claim 16 further comprising a first idle gear drivingly engaging said polishing disk and a second idle gear carried by said transmission shaft in meshing relationship to said first idle gear.

18. The pad conditioning unit of claim 17 wherein said first drive gear comprises a drive pinion gear, said second drive gear comprises a drive worm gear, said first idle gear comprises an idle pinion gear and said second idle gear comprises an idle worm gear.

* * * * *